(12) United States Patent
Daubenspeck et al.

(10) Patent No.: US 8,508,043 B2
(45) Date of Patent: Aug. 13, 2013

(54) METAL PAD STRUCTURE FOR THICKNESS ENHANCEMENT OF POLYMER USED IN ELECTRICAL INTERCONNECTION OF SEMICONDUCTOR DIE TO SEMICONDUCTOR CHIP PACKAGE SUBSTRATE WITH SOLDER BUMP (75) Inventors: Timothy H. Daubenspeck, Colchester, VT (US); Jeffrey P. Gambino, Westford, VT (US); Christopher D. Muzzy, Burlington, VT (US); David L. Questad, Hopewell Junction, NY (US); Wolfgang Sauter, Hinesburg, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/298,183

(22) Filed: Nov. 16, 2011

(65) Prior Publication Data

US 2013/0119534 A1 May 16, 2013

(51) Int. Cl.
H01L 31/00 (2006.01)

(52) U.S. Cl.
USPC ............ 257/737; 257/E23.068; 257/E21.508; 257/E31.12; 257/E31.121; 257/E31.128; 257/459; 257/700; 257/738; 257/734; 257/780; 257/783

(58) Field of Classification Search
USPC .................. 257/737, 738, 734, 778, 780, 783, 257/459, 685, 700, 763, 764, E21.508, E23.068, 257/E31.12, E31.121, E31.128
See application file for complete search history.

(56) References Cited

U.S. PATENT DOCUMENTS

| | | |
|---|---|---|
| 5,248,903 A | 9/1993 | Heim |
| 6,028,367 A | 2/2000 | Yu |
| 6,239,703 B1 | 5/2001 | Friedman et al. |
| 6,551,916 B2 | 4/2003 | Lin et al. |
| 6,734,566 B2 | 5/2004 | Honda |
| 6,825,541 B2 | 11/2004 | Huang et al. |
| 7,098,540 B1 | 8/2006 | Mohan et al. |
| 7,759,137 B2 | 7/2010 | Pendse et al. |
| 7,863,705 B2 | 1/2011 | Yamazaki |
| 2007/0290343 A1 | 12/2007 | Harada et al. |
| 2008/0142968 A1 | 6/2008 | Jadhav et al. |
| 2009/0189286 A1 | 7/2009 | Daubenspeck et al. |
| 2011/0006422 A1 | 1/2011 | Daubenspeck et al. |
| 2011/0147922 A1 | 6/2011 | Bezama et al. |

OTHER PUBLICATIONS

Patent Cooperation Treaty, Notification of Transmittal of the International Search Report and the Written Opinion of the International Searching Authority, or the Declaration for PCT/US2012/52749 dated Nov. 26, 2012.
Schiltz, "An Empirical Model for Planarization with Polymer Solutions," Aug. 1995, pp. 4185-4194, Japanese Journal of Applied Physics, vol. 34, Part 1, No. 8A.

*Primary Examiner* — A O Williams
(74) *Attorney, Agent, or Firm* — Richard M. Kotulak; Hoffman Warnick LLC (57) ABSTRACT A topographical feature is formed proximate to a conductive bond pad that is used to couple a solder bump to a semiconductor die. The topographical feature is separated from the conductive bond pad by a gap. In one embodiment, the topographical feature is formed at a location that is slightly beyond the perimeter of the solder bump, wherein an edge of the bump is aligned vertically to coincide with the gap separating the conductive bond pad from the topographical feature. The topographical feature provides thickness enhancement of a non-conductive layer disposed over the semiconductor die and the conductive bond pad and stress buffering.

19 Claims, 5 Drawing Sheets

METAL PAD STRUCTURE FOR THICKNESS ENHANCEMENT OF POLYMER USED IN ELECTRICAL INTERCONNECTION OF SEMICONDUCTOR DIE TO SEMICONDUCTOR CHIP PACKAGE SUBSTRATE WITH SOLDER BUMP

BACKGROUND

Embodiments of the present invention relate generally to semiconductor chip packaging, and more specifically to a metal pad structure for thickness enhancement of a polymer used in the electrical interconnection of a semiconductor die to a semiconductor chip package substrate with a solder bump.

In a typical assembly of a semiconductor die or integrated circuit to a semiconductor chip package substrate, solder bumps are attached to respective bond pads formed on the die. The semiconductor die is then placed onto the semiconductor chip package substrate. An anneal is performed to join the solder bumps on the semiconductor die to respective bond pads on the semiconductor chip package substrate. Typically, there is a high degree of mismatch between the coefficients of thermal expansion (CTE) between the solder bumps, the semiconductor die and the semiconductor chip package substrate. The mismatch of CTE results in the formation of large strains that cause thermal stresses to develop about the solder bumps and the semiconductor die during thermal cycling. In particular, during the semiconductor die-join cool-down, the solder bumps that are located near the edges and corners of the semiconductor die experience a deformation due to the high degree of mismatch between the CTE between the bumps, the die and the semiconductor chip package substrate. This deformation exerts a rotational force on the bumps at the edges and corners of the semiconductor die, causing them to rotate up and away from their connection with the die. As a result, back-end-of-the-line (BEOL) material that lies underneath the solder bumps in the semiconductor die becomes stressed and may fracture.

SUMMARY

In one embodiment, a structure is provided. In this embodiment, the structure comprises at least one solder bump, a semiconductor die, and at least one conductive bond pad formed upon a surface of the semiconductor die to receive the at least one solder bump. The structure further comprises a topographical feature formed upon the surface of the semiconductor die proximate the at least one conductive bond pad. A gap of a predetermined amount separates the topographical feature from the at least one conductive bond pad. The topographical feature is formed upon the surface of the semiconductor die at a location that is slightly beyond a perimeter of the at least one solder bump. The structure further comprises a non-conductive layer disposed over the semiconductor die and the at least one conductive bond pad and the topographical feature. The thickness of the non-conductive layer beyond an edge of the at least one conductive bond pad is enhanced from the thickness of the non-conductive layer disposed over the at least one conductive bond pad by the presence of the topographical feature.

In a second embodiment, a packaged semiconductor device is provided. In this embodiment, the packaged semiconductor device comprises a semiconductor chip package substrate, a plurality of solder bumps and a semiconductor die that connects to the semiconductor chip package substrate through the plurality of solder bumps. The packaged semiconductor device further comprises a plurality of conductive bond pads formed upon a surface of the semiconductor die that each receives one of the plurality of solder bumps. In addition, the packaged semiconductor device comprises a plurality of topographical features formed upon the surface of the semiconductor die. Each of the plurality of topographical features is proximate one of the plurality of conductive bond pads. A gap of a predetermined amount separates each topographical feature from a conductive bond pad proximate thereto. Each topographical feature is formed upon the surface of the semiconductor die at a location that is slightly beyond a perimeter of one of the plurality of solder bumps. The packaged semiconductor device further comprises a non-conductive layer disposed over the semiconductor die and the plurality of conductive bond pads and the plurality of topographical features. The thickness of the non-conductive layer beyond an edge of each of the plurality of conductive bond pads is enhanced from the thickness of the non-conductive layer disposed over the conductive bond pad by the presence of one of the plurality of topographical features proximate thereto.

DETAILED DESCRIPTION

Figure 1:
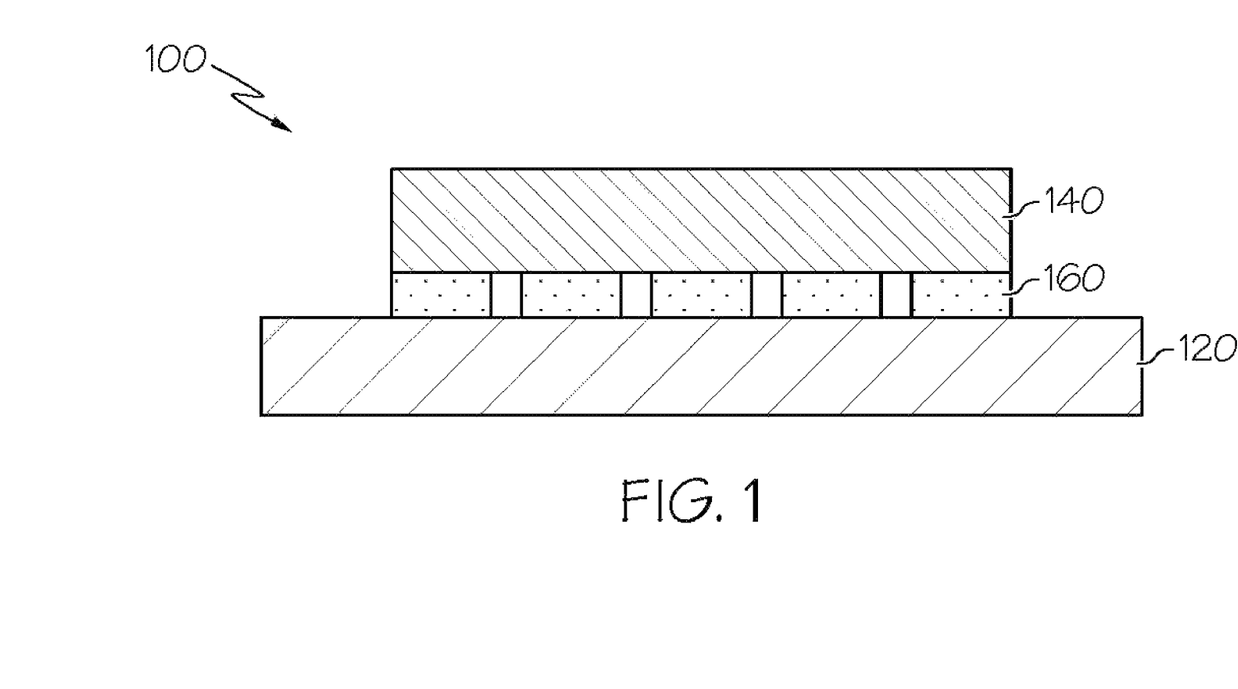
FIG. 1 shows a cross-sectional view of a packaged semiconductor device in which embodiments of the present invention may be utilized.

FIG. 1 shows a cross-sectional view of a packaged semiconductor device 100 in which embodiments of the present invention may be utilized. Packaged semiconductor device 100 includes a semiconductor chip package substrate 120 and a semiconductor die 140 having solder bumps (e.g., controlled collapse chip connection (C4) contacts) 160 attached to a surface of the die that connect to respective bond pads (not shown) disposed on a surface of semiconductor chip package substrate 120 to form a metallurgical joint. Solder bumps 160 may be any solderable material that can include, but is not limited to, material having tin and lead, tin without lead, tin with a residual of copper or silver, tin bismuth, tin indium, etc.

Typically, there is a high degree of mismatch between the coefficients of thermal expansion (CTE) between solder bumps 160, semiconductor die 140 and semiconductor chip package substrate 120. The mismatch of CTE results in the formation of large strains that cause thermal stresses to develop about solder bumps 160 and semiconductor die 140 during thermal cycling.

Figure 2:
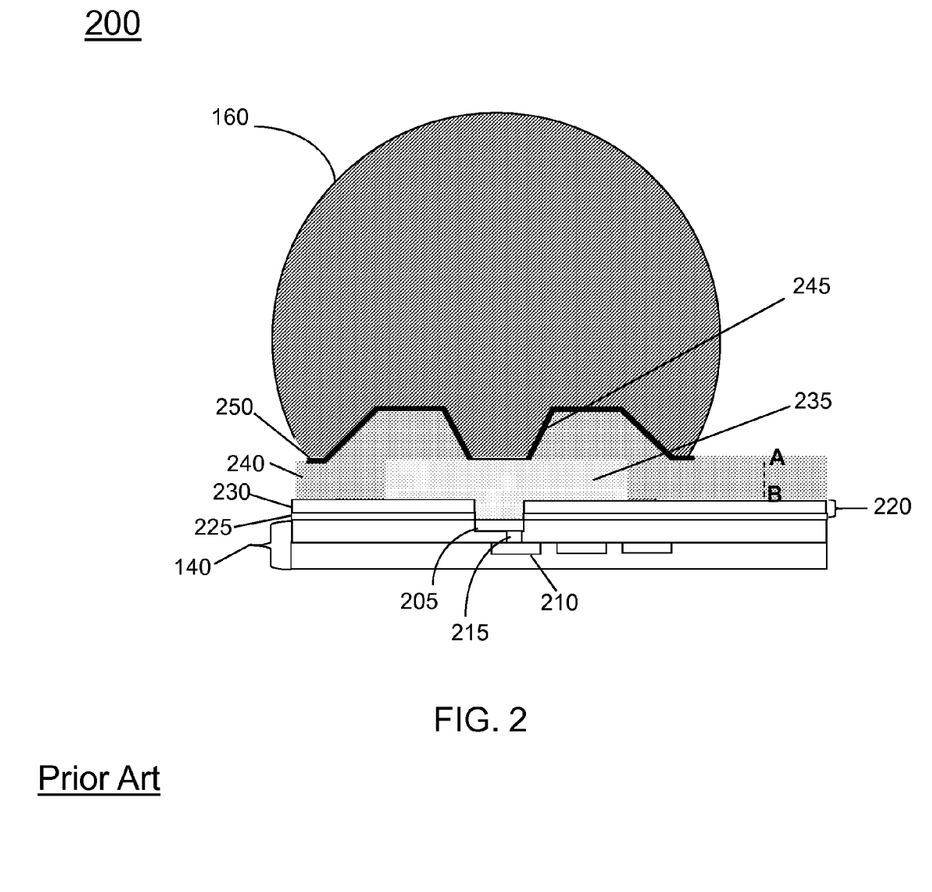
FIG. 2 shows a cross-sectional view of a semiconductor structure according to the prior art.

FIG. 2 shows a cross-sectional view of a semiconductor structure 200 according to the prior art that uses a non-conductive layer such as a polymer that has been used as part of packaged semiconductor device 100 depicted in FIG. 1. Note that solder bump 160 and semiconductor die 140 are flipped from their position depicted in FIG. 1. For ease of illustration, FIG. 2 only shows a specific portion of semiconductor structure 200. Those skilled in the art will recognize that semiconductor structure 200 extends to the left and to the right of the portion shown in FIG. 2. As a result, there will be additional solder bumps 160, and likewise underfill materials, which are described below, that are positioned between the solder bumps 160 and semiconductor die 140.

As shown in FIG. 2, semiconductor structure 200 comprises a semiconductor die 140 that may have various circuit components (not shown) integrated therein that are connected through internal signal lines (not shown). Metal line 205 represents the last metal line in semiconductor die 140 that provides electrical connection to the other circuit components (e.g., transistors, capacitors, resistors, etc.) in the die that connect to a metal line 210. As shown in FIG. 2, a via 215 connects metal line 205 to metal line 210. A passivation layer 220 is formed on a surface of semiconductor die 140. Passivation layer 220 may comprise dielectric layers 225 and 230. Dielectric layers 225 can comprise, for example, silicon nitride, while dielectric layer 230 can comprise, for example, silicon dioxide. A conductive bond pad 235 is formed upon passivation layer 220 to attach to solder bump 160. Conductive bond pad 235 may be an electrically conductive material such as aluminum or copper.

A non-conductive layer 240 is disposed over passivation layer 220 and conductive bond pad 235. As shown in FIG. 2, non-conductive layer 240 is disposed over the entire surface of passivation layer 220 and conductive bond pad 235 and underneath solder bump 160. Furthermore, non-conductive layer 240 is a non-conformal or planarizing (including partially planarizing) layer. Non-conductive layer 240 may comprise a polymer such as polyimide or benzocyclobutene (BCB). Polyimide can be photosensitive polyimide (PSPI) or non-photosensitive polyimide. Similarly, BCB can be photosensitive BCB or non-photosensitive BCB. Those skilled in the art will recognize that other polymers can be used, especially those that are insulators, have a low dielectric constant (e.g., less than about 4) and are thermally stable up to 400 degrees Celsius or greater.

A via 245 extends upwardly from conductive bond pad 235 through non-conductive layer 240. Via 245 may comprise a hole or trench formed by a conventional lithographic process. As shown in FIG. 2, a ball limiting metallurgy layer (BLM) 250 is disposed in via 245 and extends upwardly therefrom along a top surface of non-conductive layer 240 underneath solder bump 160 to a location that is approximately coincident with the perimeter of the bump. BLM layer 250 may comprise multiple barrier layers. For example, BLM layer 250 may comprise a titanium-tungsten (TiW) alloy diffusion barrier layer and a copper-chrome copper (Cu/CrCu) layer. Those skilled in the art will recognize that BLM layer 250 may be made from other materials. Furthermore, those skilled in the art will recognize that BLM layer 250 may have additional layers besides the aforementioned layers. For example, a nickel (Ni) layer may be placed on top of the Cu/CrCu layer.

Non-conductive layer 240 is generally effective at reducing thermal stresses from developing in semiconductor die 140. In particular, non-conductive layer 240 reduces thermal stresses at the edges or corners of solder bump 160. The effectiveness of using non-conductive layer 240 to reduce thermal stresses from developing at the edges or corners of solder bump 160 increases as the thickness increases. However, if the thickness of non-conductive layer 240 is made too thick, other stresses will develop in other locations of semiconductor die 140 such as at the metal in the back-end-of-the-line (BEOL) material that lies underneath solder bump 160. This stress that arises in the BEOL material underneath solder bump 160 translates to a high pressure that causes breakage to occur. Therefore, it is desirable to use a non-conductive layer that has a thickness that creates a sufficient stress buffer underneath the solder bump, but not be too much so that it induces stresses to develop in other parts of the semiconductor to occur.

The various embodiments of the present invention use an artificial structure such as a topographical feature proximate to conductive bond pad 235 to provide a sufficient amount of non-conductive layer over semiconductor die 140 and the bond pad, such that a stress buffer is created that prevents breakage at high stress areas (i.e., at the edges or corners of solder bump 160 and in the BEOL material underneath the bump). As explained below in more detail, having the topographical feature proximate to conductive bond pad 235 such that there is a gap therebetween, and the edge of solder bump 160 is vertically aligned to coincide with the gap, actually bolsters or enhances the thickness of the non-conductive layer in this location. As a result, the thickness of conductive bond pad 235 underneath the edges or corners of solder bump 160 (i.e., where the compressive forces associated with the semiconductor die-join cool-down can be the greatest) is selectively enhanced to buffer such stresses, while leaving the thickness of non-conductive layer 240 above the bond pad unenhanced, but sufficiently able to buffer stresses that develop in that part of semiconductor die 140 (i.e., in the BEOL material underneath the bump) that is prone to breakage if the thickness is too much.

Figure 3:
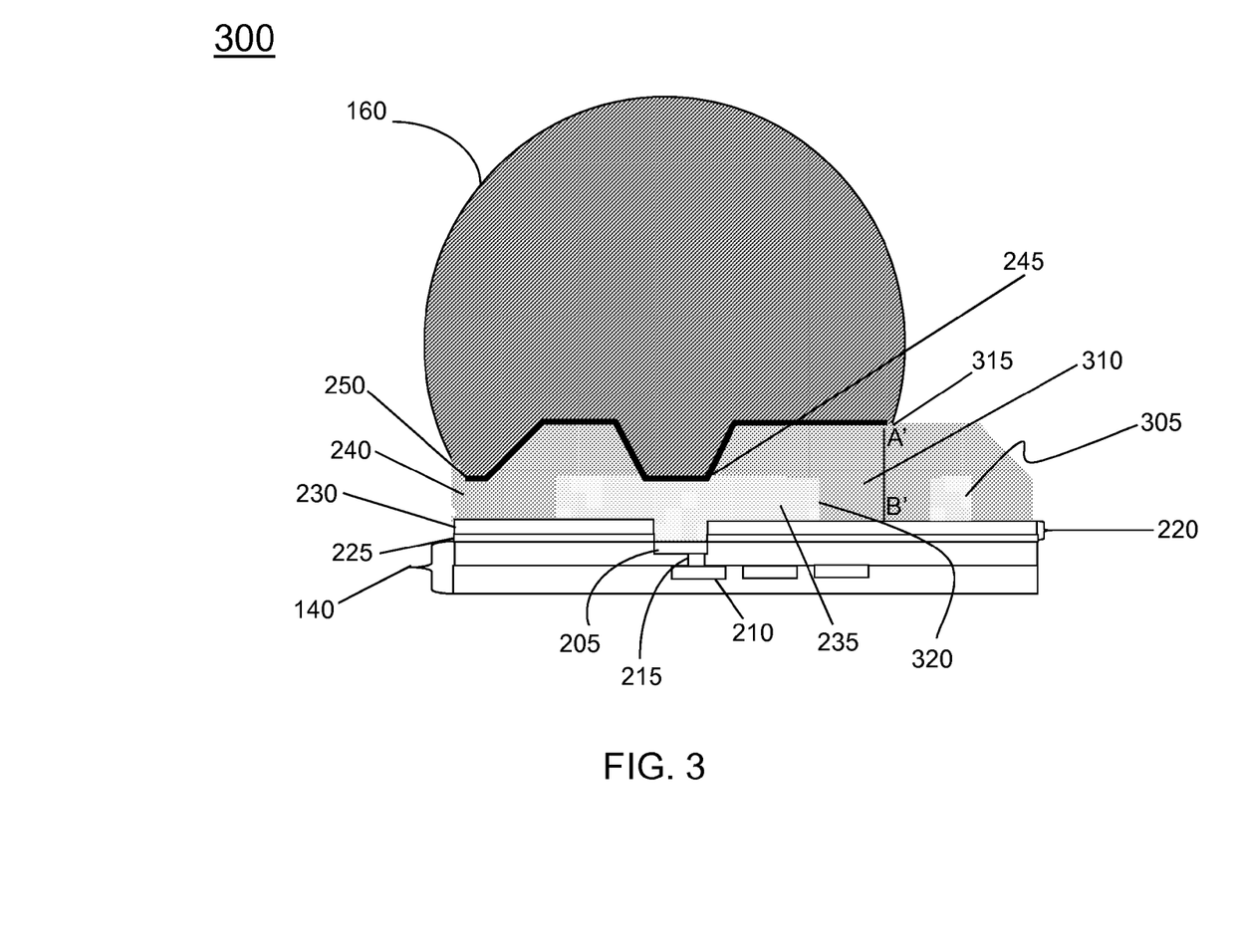
FIG. 3 shows a cross-sectional view of a semiconductor structure according to one embodiment of the present invention.

FIG. 3 shows a cross-sectional view of a semiconductor structure 300 according to one embodiment of the present invention that uses the aforementioned topographical feature. For clarity and ease of describing embodiments of the present invention, elements described in FIG. 2 that are shown in FIG. 3 contain the same reference numerals. Because the same reference numerals represent the same elements described in FIG. 2, a separate discussion of these elements is not provided again for FIG. 3.

Semiconductor structure 300 of FIG. 3 further includes a topographical feature 305 formed upon a surface of semiconductor die 140 proximate conductive bond pad 235. In one embodiment, as shown in FIG. 3, topographical feature is disposed on passivation layer 220, and in particular, on dielectric layer 230. Topographical feature 305 may comprise a conductive material such as aluminum, copper, etc. In another embodiment, topographical feature 305 may comprise a nonconductive material.

A gap 310 of a predetermined amount separates topographical feature 305 from conductive bond pad 235. Those skilled in the art will appreciate that the amount of space in the gap can vary depending on the application of semiconductor structure 300, and the thickness amount of non-conductive layer 240 that is desired to attain sufficient stress buffering at the edges or corners of solder bump 160 and in parts of the die that are susceptible to cause breakage of BEOL materials. In one embodiment, gap 310 is approximately equal to, or exceeds a thickness of conductive bond pad 240.

Also as shown in this embodiment of FIG. 3, topographical feature 305 is formed upon the surface of semiconductor die 140 at a location that is slightly beyond a perimeter of solder bump 160. In particular, an edge 315 of solder bump 160 is in a location on a surface of non-conductive layer 240 that aligns vertically to coincide with gap 310.

Topographical feature 305 in the configuration illustrated in FIG. 3 and in the various other embodiments described herein serves to enhance or bolster the thickness of non-conductive layer 240 beyond an edge 320 of conductive bond pad 235 in gap 310, extending to topographical feature 305 and up to the perimeter of edge 315 of solder bump 160. A comparison of semiconductor structure 200 in FIG. 2 to semiconductor structure 300 in FIG. 3 shows that the thickness of non-conductive layer 240 disposed over semiconductor die 140 from the region extending from an edge of conductive bond pad 235 along the surface of the die past the edge of solder ball 160, as represented by line A-B (FIG. 2), is smaller than the thickness of non-conductive layer 240 disposed in gap 310 extending from edge 320 of conductive bond pad 235 to topographical feature 305, up to edge 315 of solder bump 160 and its perimeter thereof, as represented by line A'-B' (FIG. 3).

In the various embodiments of the present invention, topographical feature 305 is able to enhance the thickness of non-conductive layer 240 in gap 310 by virtue of the natural planarizing behavior of the polymer material. In addition, topographical feature 305 provides a stress buffer that inhibits breakage at high stress points (i.e., at the corners and edge of solder bump 160 and in the BEOL material underneath the bump) by taking advantage of the material properties of a non-conductive layer such as a polymer (e.g., PSPI, BCB, etc.) as it is deposited on top of another layer. In particular, a non-conductive layer such as a polymer, when deposited on a layer using any one of a number of well-known deposition techniques is known to be deposited in a manner that is largely, but not completely planar, and only slightly conformal. For example, when a non-conductive layer such as a polymer is deposited over a conductive bond pad like in the configuration illustrated in FIG. 2, the coverage contour of the polymer as it is deposited past the edges of the bond pad tends to taper off gradually, resulting in a localized thickness of polymer adjacent to the very edge of the bond pad that is greater than the polymer thickness in any flat region such as directly over the top of the bond pad or far away from the edge of the pad in a flat field area. The thickness of polymer immediately below the edge of the solder bump is design-dependent in that it depends on exactly where the bond pad edge lies in relation to the bump edge. In a pad/bump structure of typical dimensions, the thickness of polymer beneath the bump edge would be similar to the thickness of polymer that covers most of the pad surface.

The use of topographical feature 305 in the various embodiments of the present invention such as the one illustrated in FIG. 3 is able to enhance or bolster the thickness of non-conductive layer 240 (i.e., the polymer) underneath the edges or corners of solder bump 160 by improving the overall flatness or effective planarization associated with the polymer, so that it is essentially becomes fully planar with the polymer coverage over the pad. The amount of thickness that topographical feature 305 can provide to the polymer depends on the amount of space in gap 310 that is between conductive bond pad 235 and the topographical feature, and the thickness of the bond pad and the feature. Generally, as the space of gap 310 between conductive bond pad 235 and topographical feature 305 decreases, the thickness of the polymer itself will increase to the limit given by the thickness of the pad together with the polymer thickness over it. Alternatively, increasing gap 310 will increase the incidence of the polymer beginning to deplanarize and start to sag, which will have a decreasing effect on the thickness. Also, for a given amount of space in gap 310, the thickness of the polymer underneath the edges or corners of solder bump 160 will increase as the thickness of one of conductive bond pad 235 and topographical feature 305 increases. Increasing the height of conductive bond pad 235 and topographical feature 305 for a given amount of space in gap 310 can also increase the thickness of the polymer. Those skilled in the art will recognize that the material properties associated with non-conductive layer 240 will also influence the degree of planarization that is achieved in gap 310.

Regardless of which factor (i.e., space in gap 310, thickness of conductive bond pad 235 and topographical feature 305, height of the conductive bond pad and the topographical feature, and the type of non-conductive layer 240) one chooses to alter to obtain the desired thickness in the gap between the bond pad and the feature, the overall effect of the topographical feature as used in the various embodiments of the present invention (assuming that one is interested in increasing the thickness of the non-conductive layer), is to form a localized effective thickness in the gap that exceeds a nominal thickness. More specifically, topographical feature 305 in its location with respect to conductive bond pad 235 and solder bump 160 through gap 310 results in localized thickening of non-conductive layer 240. This causes the resulting thickness of the non-conductive layer to be thicker than if it were otherwise deposited on a flat area on a wafer. Generally, the effective localized thickening of non-conductive layer 240 in this region will equal the basic apply thickness of the layer plus the thickness of topographical feature 305. The localized thickening of non-conductive layer 240 in gap 310 enables the various embodiments of the present invention to provide a stress buffer underneath the edges or corners of solder bump 160 where tensile rotational forces are the greatest, and a stress buffer in that part of semiconductor die 140 that is prone to have breakage of BEOL material due to these forces.

In the various embodiments of the present invention, topographical feature 305 may comprise any shaped geometry that can substantially surround conductive bond pad 235. In one embodiment, topographical feature 305 may comprise a circular shape such that it forms an annular ring around conductive bond pad 235 when viewed from a top view, wherein gap 310 separates the topographical feature from the bond pad. Those skilled in the art will recognize that topographical feature 305 can take the form of other shapes that can surround conductive bond pad 235 and gap 310. Other examples of shapes that topographical feature 305 may have include a square shape, a rectangular shape, polygon shape, etc. Regardless of what shape is deployed for topographical feature 305, it is desirable to have edge 315 of solder bump 160 lie outside of the edge of conductive bond pad 235, such that it vertically aligns to coincide within gap 310.

Figure 4:
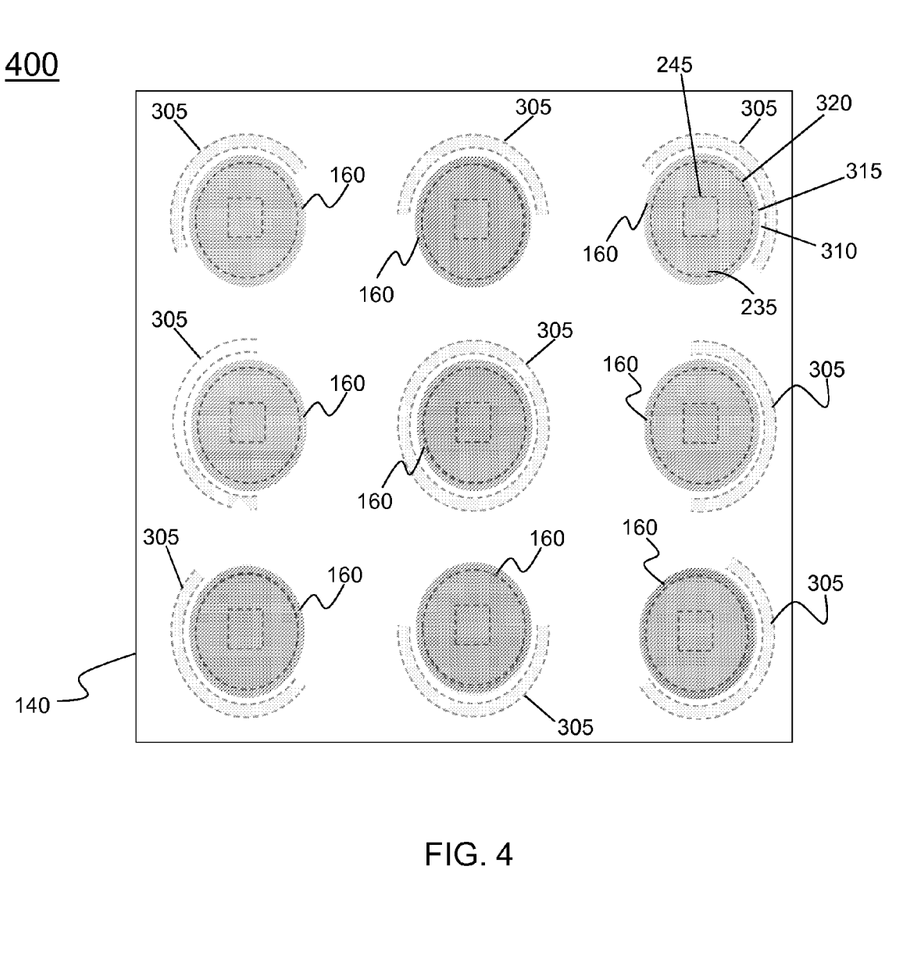
FIG. 4 shows a top-down schematic view of a semiconductor structure according to a second embodiment of the present invention.

The various embodiments of the present invention are not limited to having the shaped-geometry of topographical feature 305 substantially surround conductive bond pad 235. In particular, the shaped-geometry associated with topographical feature 305 may partially surround conductive bond pad 235. FIG. 4 shows a top-down schematic view of a semiconductor structure 400 of semiconductor die 140 that uses topographical features 305 that partially surround conductive bond pads 235. Those skilled in the art will recognize that a typical semiconductor die would have a significant amount more solder bumps 160 than what is illustrated in the schematic of FIG. 4. For example, each particular solder bump 160 illustrated in FIG. 4 could actually have thousands of solder bumps in that region that it occupies in the figure.

As shown in FIG. 4, semiconductor structure 400 could comprise a semiconductor die 140 that utilizes topographical features 305 that substantially surround and partially surround solder bumps 160 and conductive bond pads 235. In one embodiment, those topographical features 305 that partially surround solder bumps 160 and conductive bond pads 235 could be placed on the side of the bump where the CTE mismatch forces are the greatest during a semiconductor die-join cool-down cycle. Typically, the breaking forces arise on the (tensile) side of the solder bump 160 that is directionally oriented towards the die edge and naturally subject to the greatest CTE torque during a semiconductor die-join cool-down. Note that FIG. 4 shows that the tensile side of the solder bump will depend on their location with respect to semiconductor die 140. The solder bump 160 in the center of FIG. 4 is substantially surrounded by a topographical feature 305. In one embodiment, such a topographical feature would signify that compressive forces all around this solder bump would be the same.

For clarity in illustrating the use of topographical features 305 that can substantially surround or partially surround solder bumps 160 and conductive bond pads 235, only one particular bump in semiconductor die 140 is shown with associated reference elements. In particular, the solder bump 160 in the upper right-hand corner of FIG. 4 shows conductive bond pad 235, edge 320 of the bond pad, via 245, gap 310 and edge 315 of the solder bump. Although not illustrated in FIG. 4, all of these reference elements illustrated for the solder bump in the upper right-hand corner would be applicable to the other bumps illustrated in the figure. Nevertheless, each solder bump 160 illustrated in FIG. 4 shows that edge 320 of conductive bond pad 235 is separated from topographical feature 305 by gap 310. In addition, each solder bump 160 illustrated in FIG. 4 shows edge 315 of the solder bump falls in between edge 320 of conductive bond pad 235 and topographical feature 305.

Figure 5:
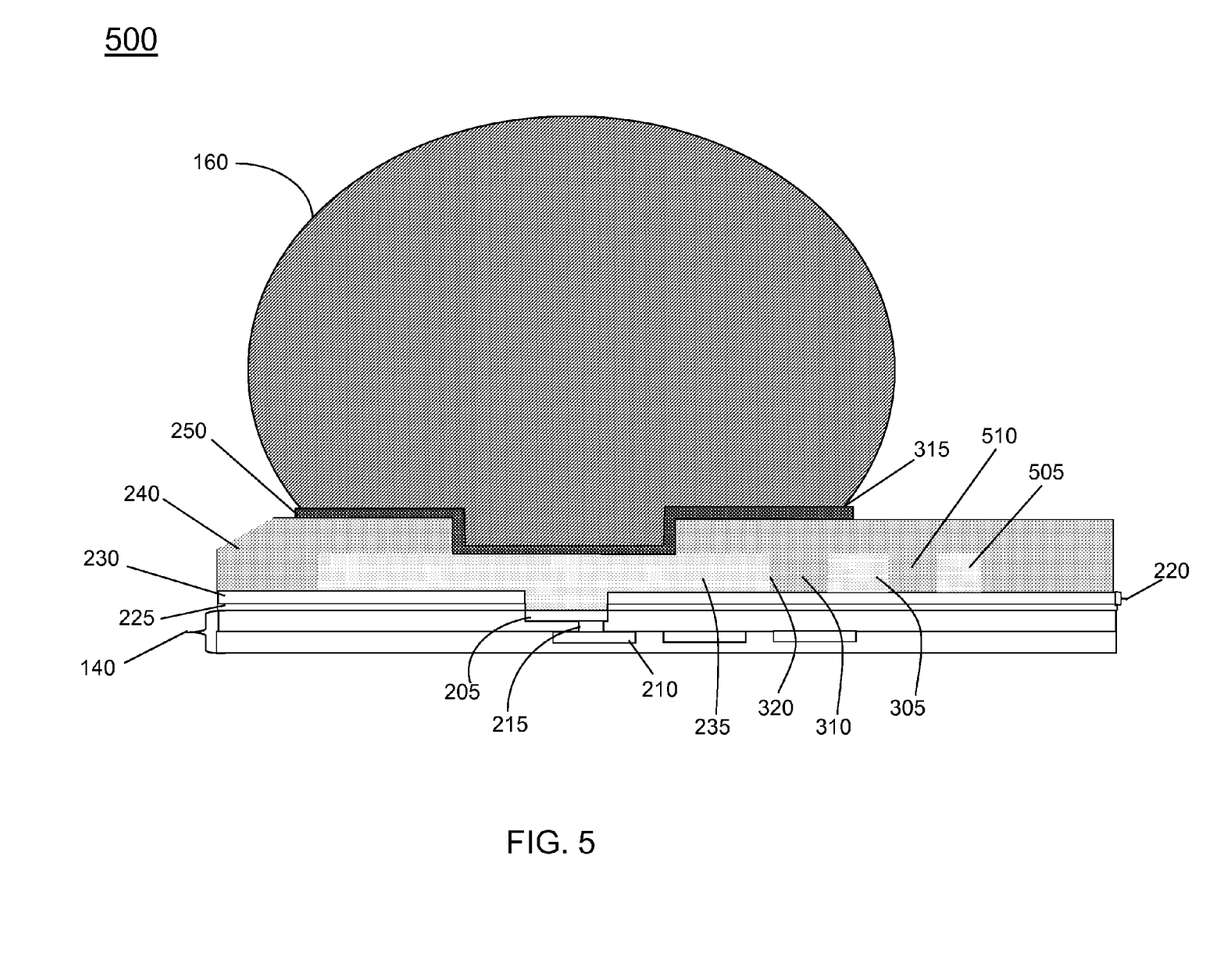
FIG. 5 shows a cross-sectional view of a semiconductor structure according to a third embodiment of the present invention.

FIG. 5 shows a cross-sectional view of a semiconductor structure 500 according to another embodiment of the present invention. For clarity and ease of describing embodiments associated with FIG. 5, elements described in FIGS. 2-3 are shown in this figure with the same reference numerals. Because the same reference numerals represent the same elements described in FIGS. 2-3, a separate discussion of these elements is not provided again for FIG. 5.

As shown in FIG. 5, semiconductor structure comprises another topographical feature 505 formed upon a surface of semiconductor die 140 that is in addition to topographical feature 305. Topographical feature 505 is separated from topographical feature 305 by a gap 510 of a predetermined spacing. In one embodiment, topographical feature 505 could be similar in material, thickness, and height to topographical feature 305. As shown in FIG. 5, topographical feature 305 is aligned vertically to coincide underneath edge 315 of solder bump 160. Topographical feature 505 is disposed at a location along the surface of semiconductor die 140 that is slightly beyond a perimeter of edge 315 of solder bump 160, separated from topographical feature 305 by gap 510. One advantage of this configuration is that it increases the relative quantity of stress buffering polymer in the region below the bump edge that is given by the two polymer channels (310,510) in combination with the adjacent topographical feature 315. It is almost certain that effective stress buffering is not strictly dependent only upon that polymer thickness located directly and immediately below the bump edge, but that the benefit derives from the effective quantity of polymer material within a critical region that extends in either direction some distance from the exact point of the bump edge. Those skilled in the art will appreciate that the desired locations of topographical feature 305 and topographical feature 505 will depend on the amount of enhanced thickness that is desired for gaps 310 and 510.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A structure, comprising:
   at least one solder bump;
   a semiconductor die;
   at least one conductive bond pad formed upon a surface of the semiconductor die to receive the at least one solder bump;
   a topographical feature formed upon the surface of the semiconductor die proximate the at least one conductive bond pad, wherein a gap of a predetermined amount separates the topographical feature from the at least one conductive bond pad, wherein the topographical feature is formed upon the surface of the semiconductor die at a location that is slightly beyond a perimeter of the at least one solder bump, and wherein an edge of the at least one solder bump is in a location that aligns vertically to coincide with the gap that separates the topographical feature from the at least one conductive bond pad; and
   a non-conductive layer disposed over the semiconductor die and the at least one conductive bond pad and the topographical feature, wherein a thickness of the non-conductive layer beyond an edge of the at least one conductive bond pad is enhanced from the thickness of the non-conductive layer disposed over the at least one conductive bond pad by the presence of the topographical feature.

2. The structure according to claim 1, wherein the non-conductive layer comprises a non-conformal or planarizing layer.

3. The structure according to claim 1, wherein the gap separating the topographical feature from the at least one conductive bond pad is approximately equal to, or exceeds a thickness of the at least one conductive bond pad.

4. The structure according to claim 1, wherein the thickness of the non-conductive layer disposed in the gap that separates the topographical feature from the at least one conductive bond pad is enhanced by the presence of the topographical feature.

5. The structure according to claim 4, wherein the thickness of the non-conductive layer disposed in the gap that separates the topographical feature from the at least one conductive bond pad has a localized effective thickness that exceeds a nominal thickness of the non-conductive layer.

6. The structure according to claim 1, wherein the topographical feature comprises a shaped-geometry that substantially surrounds the at least one conductive bond pad.

7. The structure according to claim 1, wherein the topographical feature comprises a shaped-geometry that partially surrounds the at least one conductive bond pad.

8. The structure according to claim 7, wherein the topographical feature is located about the at least one conductive bond pad on a side of the at least one solder bump where coefficients of thermal expansion (CTE) mismatch forces are the greatest during a semiconductor die-join cool-down.

9. The structure according to claim 1, wherein the non-conductive layer comprises a polymer.

10. The structure according to claim 9, wherein the polymer is selected from the group consisting of photosensitive polyimide (PSPI), non-photosensitive polyimide, photosensitive benzocyclobutene (BCB), and non-photosensitive BCB.

11. A packaged semiconductor device, comprising:
    a semiconductor chip package substrate;
    a plurality of solder bumps;

a semiconductor die that connects to the semiconductor chip package substrate through the plurality of solder bumps;

a plurality of conductive bond pads formed upon a surface of the semiconductor die that each receives one of the plurality of solder bumps;

a plurality of topographical features formed upon the surface of the semiconductor die, each of the plurality of topographical features proximate one of the plurality of conductive bond pads, wherein a gap of a predetermined amount separates each topographical feature from a conductive bond pad proximate thereto, and wherein each topographical feature is formed upon the surface of the semiconductor die at a location that is slightly beyond a perimeter of one of the plurality of solder bumps; and a non-conductive layer disposed over the semiconductor die and the plurality of conductive bond pads and the plurality of topographical features, wherein a thickness of the non-conductive layer beyond an edge of each of the plurality of conductive bond pads is enhanced from the thickness of the non-conductive layer disposed over the conductive bond pad by the presence of one of the plurality of topographical features proximate thereto.

12. The packaged semiconductor device according to claim 11, wherein the gap separating each of the plurality of topographical features from the conductive bond pad proximate thereto is approximately equal to, or exceeds a thickness of the conductive bond pad.

13. The packaged semiconductor device according to claim 11, wherein the thickness of the non-conductive layer disposed in the gap that separates each of the plurality of topographical features from a conductive bond pad proximate thereto is enhanced by the presence of the topographical feature.

14. The packaged semiconductor device according to claim 11, wherein an edge of each of the plurality of solder bumps is in a location that aligns vertically to coincide with the gap that separates each of the plurality of topographical features from a conductive bond pad proximate thereto.

15. The packaged semiconductor device according to claim 11, wherein each of the plurality of topographical features comprises one of a shaped-geometry that substantially surrounds one of the plurality of conductive bond pads, a shaped-geometry that partially surrounds the at least one conductive bond pad, and combinations thereof.

16. The packaged semiconductor device according to claim 15, wherein each of the plurality of topographical features is located about a conductive bond pad proximate thereto on a tensile side of one of the plurality of solder bumps connecting thereto.

17. The packaged semiconductor device according to claim 11, wherein the non-conductive layer comprises a polymer.

18. The packaged semiconductor device according to claim 17, wherein the polymer is selected from the group consisting of photosensitive polyimide (PSPI), non-photosensitive polyimide, photosensitive benzocyclobutene (BCB), and non-photosensitive BCB.

19. A structure, comprising:
at least one solder bump;
a semiconductor die;
at least one conductive bond pad formed upon a surface of the semiconductor die to receive the at least one solder bump;
a topographical feature formed upon the surface of the semiconductor die proximate the at least one conductive bond pad, wherein a gap of a predetermined amount separates the topographical feature from the at least one conductive bond pad, wherein the topographical feature is formed upon the surface of the semiconductor die at a location that is slightly beyond a perimeter of the at least one solder bump, and wherein the topographical feature comprises a first topographical feature and a second topographical feature separated a predetermined distance away from the first topographical feature, wherein the first topographical feature is aligned vertically to coincide underneath an edge of the at least one solder bump and the second topographical feature is disposed at a location that is slightly beyond a perimeter of the edge of the at least one solder bump that vertically coincides with the first topographical feature; and
a non-conductive layer disposed over the semiconductor die and the at least one conductive bond pad and the topographical feature, wherein a thickness of the non-conductive layer beyond an edge of the at least one conductive bond pad is enhanced from the thickness of the non-conductive layer disposed over the at least one conductive bond pad by the presence of the topographical feature.

* * * * *